US010989752B2

(12) United States Patent
Schweitzer, III et al.

(10) Patent No.: US 10,989,752 B2
(45) Date of Patent: Apr. 27, 2021

(54) DISTANCE PROTECTION USING TRAVELING WAVES IN AN ELECTRIC POWER DELIVERY SYSTEM

(71) Applicant: Schweitzer Engineering Laboratories, Inc., Pullman, WA (US)

(72) Inventors: Edmund O. Schweitzer, III, Pullman, WA (US); Bogdan Z. Kasztenny, Markham (CA)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 244 days.

(21) Appl. No.: 16/137,343

(22) Filed: Sep. 20, 2018

(65) Prior Publication Data

US 2019/0094291 A1    Mar. 28, 2019

Related U.S. Application Data

(60) Provisional application No. 62/562,275, filed on Sep. 22, 2017.

(51) Int. Cl.
  *G01R 31/11* (2006.01)
  *H02H 1/00* (2006.01)
  (Continued)

(52) U.S. Cl.
  CPC ............ *G01R 31/11* (2013.01); *G01R 31/085* (2013.01); *H02H 1/0007* (2013.01);
  (Continued)

(58) Field of Classification Search
  CPC .... H02H 1/0007; H02H 1/0092; H02H 7/265; G01R 31/11; G01R 19/2513; G01R 31/085
  See application file for complete search history.

(56) References Cited

U.S. PATENT DOCUMENTS 5,272,439 A   12/1993   Mashikian
6,369,996 B1   4/2002   Bo
(Continued)

FOREIGN PATENT DOCUMENTS

CN        103884963      6/2014
CN        104730419      6/2015
(Continued)

OTHER PUBLICATIONS

PCT/US2018/052480 Patent Cooperation Treaty, International Search Report and Written Opinion of the International Searching Authority, dated Nov. 26, 2018.
(Continued)

*Primary Examiner* — Rafael O De Leon Domenech
(74) *Attorney, Agent, or Firm* — Jared L. Cherry; Richard M. Edge (57) ABSTRACT

The present disclosure pertains to systems and methods to detect faults in electric power delivery systems. In one embodiment, a data acquisition system may acquire a plurality of electric power delivery system signals from an electric power transmission line. A traveling wave system may detect a traveling wave based on the plurality of electric power delivery system signals received from the data acquisition system. The traveling wave may be analyzed using a first mode to determine a first mode arrival time and using a second mode to determine a second mode arrival time. A time difference between the first mode arrival time and the second mode arrival time may be determined. A fault location system may estimate or confirm a location of the fault based on the time difference. A protection action module may implement a protective action based on the location of the fault.

21 Claims, 8 Drawing Sheets

(51) Int. Cl.
*H02H 7/26* (2006.01)
*G01R 31/08* (2020.01)
*G01R 19/25* (2006.01)

(52) U.S. Cl.
CPC .......... *H02H 1/0092* (2013.01); *H02H 7/265* (2013.01); *G01R 19/2513* (2013.01)

(56) References Cited

U.S. PATENT DOCUMENTS

| | | |
|---|---|---|
| 6,798,211 B1 | 9/2004 | Rockwell |
| 2006/0012374 A1 | 1/2006 | Kojovic |
| 2009/0230974 A1 | 9/2009 | Kojovic |
| 2010/0217548 A1 | 8/2010 | Faybisovich |
| 2013/0096854 A1* | 4/2013 | Schweitzer, III .... G01R 31/085 702/59 |
| 2015/0081234 A1 | 3/2015 | Schweitzer, III et al. |
| 2015/0081235 A1 | 3/2015 | Schweitzer |
| 2016/0077149 A1 | 3/2016 | Schweitzer, III |
| 2016/0241336 A1 | 8/2016 | Kasztenny |
| 2017/0012424 A1 | 1/2017 | Schweitzer, III et al. |
| 2017/0082675 A1 | 3/2017 | Schweitzer, III et al. |
| 2017/0110875 A1 | 4/2017 | Schweitzer, III et al. |
| 2018/0301895 A1* | 10/2018 | Sri Gopala Krishna Murthi ........ H02H 3/40 |
| 2019/0391191 A1* | 12/2019 | Obbalareddi Demudu ................ G01R 31/088 |

FOREIGN PATENT DOCUMENTS

| | | |
|---|---|---|
| CN | 103364604 | 6/2016 |
| CN | 103604991 | 3/2017 |
| WO | 2016139613 | 9/2016 |
| WO | 2016177407 | 11/2016 |

OTHER PUBLICATIONS

Edmund O. Schweitzer, III, Armando Guzman, Mangapathirao V. Mynam, Veselin Skendzic, Bogdan Kasztenny, Stephen Marx; Locating Faults by the Traveling Waves they Launch, 2014 Texas A&M Conference for Protective Relay Engineers, Feb. 10, 2014.

Yadong Liu, Gehao Sheng, Zhimin He, Xiuchen Jiang, A Traveling Wave Fault Location Method for Earth Faults Based on Mode Propagation Time Delays of Multi-Measuring Points, Przeglad Elektrotechniczny (Electrical Review), Jan. 2012.

PCT/US2018/052204 Patent Cooperation Treaty, International Search Report and Written Opinion of the International Searching Authority, dated Dec. 21, 2018.

PCT/US2018/052207 Patent Cooperation Treaty, International Search Report and Written Opinion of the International Searching Authority, dated Dec. 10, 2018.

PCT/US2018/052196 Patent Cooperation Treaty, International Search Report and Written Opinion of the International Searching Authority, dated Dec. 21, 2018.

* cited by examiner

DISTANCE PROTECTION USING TRAVELING WAVES IN AN ELECTRIC POWER DELIVERY SYSTEM

RELATED APPLICATION

The present application claims priority under 35 U.S.C. § 119 to U.S. Provisional Patent Application No. 62/562,275, titled DISTANCE PROTECTION USING TRAVELING WAVES IN AN ELECTRIC POWER DELIVERY SYSTEM filed Sep. 22, 2017, which is incorporated by reference.

TECHNICAL FIELD

This disclosure relates to distance protection using a traveling wave in an electric power delivery system. In addition, this disclosure relates to determining a distance to a fault using a difference in traveling wave arrival times calculated using different mode models.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Traveling waves ("TWs") are surges of electricity resulting from sudden changes in voltage that propagate at a speed near the speed of light along overhead power lines. When launched by a line fault, these TWs carry information about the fault location and type. Furthermore, this information arrives at the line terminals within 1 to 2 ms depending on the line length and fault location. Relative arrival times and polarities of TWs allow for location of faults with accuracy on the order of a single tower span, as well as to protect the line with a permissive over-reaching transfer trip (POTT) scheme using TW-based directional elements (TW32) and with a TW-based line current differential scheme (TW87). These TW-based line protections utilize a communication channel, which may be either a standard pilot channel for the POTT scheme or a direct fiber-optic channel for the TW87 scheme; and may use current TWs, taking advantage of the adequate frequency response of current measurement devices. In various embodiments, line protection systems consistent with the present disclosure may operate on the order of 1 to 2 ms without a communication channel.

Figure 1:
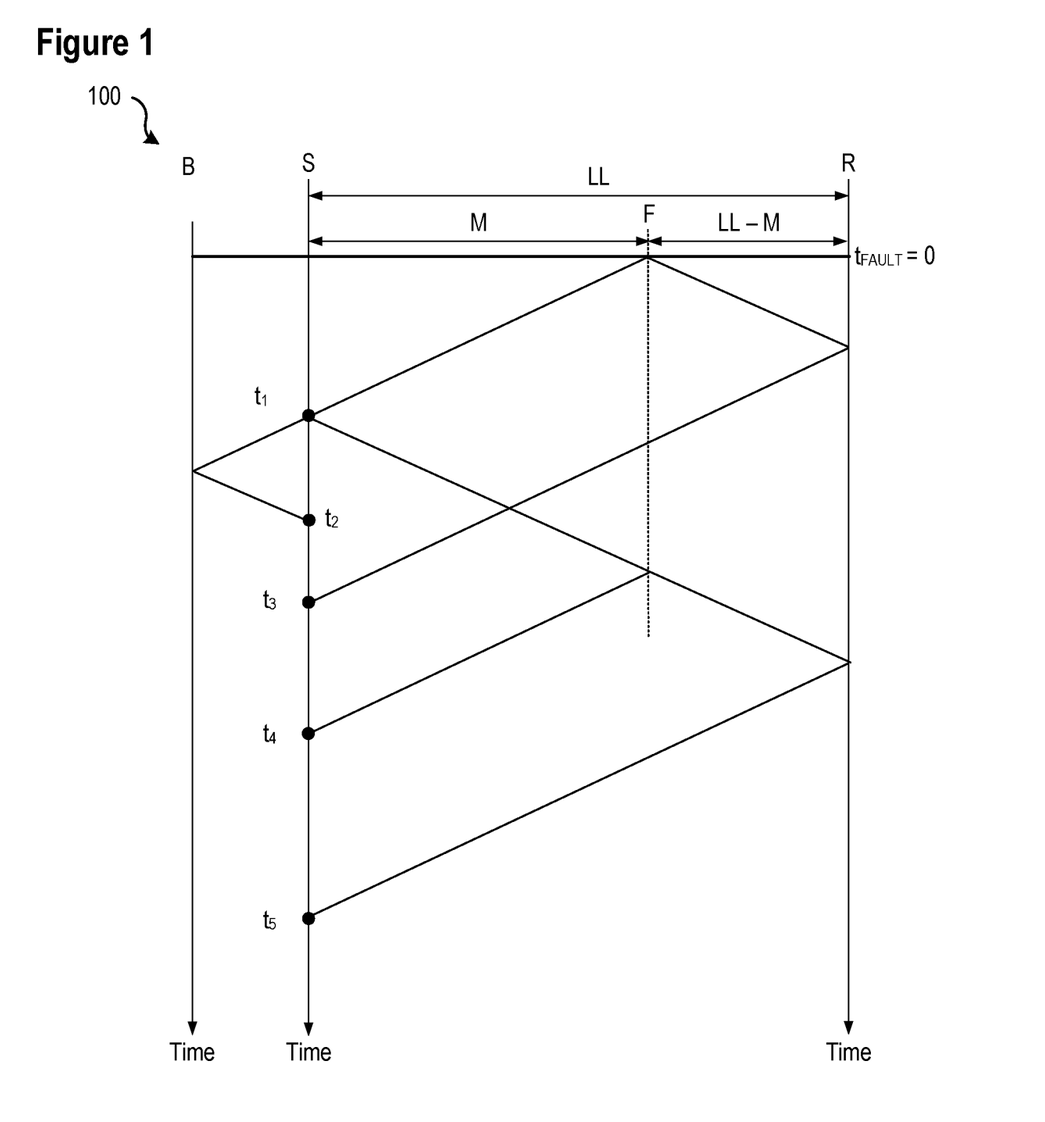
FIG. 1 shows a Bewley diagram for a fault at a location on an electric power system line consistent with embodiments of the present disclosure.

FIG. 1 shows a Bewley diagram for a fault at location F on an electric power system line of length LL consistent with embodiments of the present disclosure. The fault is M (km or mi) away from the local terminal (S) and LL−M (km or mi) away from the remote terminal (R). Consider another terminal (B) behind the local terminal. A TW line propagation time (TWLPT) is the time it takes for a TW to travel from one line terminal to the opposite terminal.

A TW launched at the fault point (F) arrives at the local terminal (S) at $t_1$. Part of the TW reflects, travels back toward the fault, reflects back from the fault, and then returns to the local terminal (S) at $t_4$. During the $t_4-t_1$ time interval, the TW travels a distance of 2·M. We write the distance-velocity-time equation as follows:

$$2 \cdot M = (t_4 - t_1) \cdot PV$$

where the propagation velocity, PV, is:

$$PV = \frac{LL}{TWLPT} \qquad \text{Eq. 2}$$

Substituting Eq. 2 into Eq. 1 and solving for M yields Eq. 3, which may be used to calculate the distance-to-fault value:

$$M = \frac{LL}{2} \frac{t_4 - t_1}{TWLPT} \qquad \text{Eq. 3}$$

Introducing a per-unit reach, TW21M, we use Eq. 3 to express an operating equation for the TW21 underreaching distance element:

$$\frac{t_F - t_1}{2 \cdot TWLPT} < TW21M \qquad \text{Eq. 4}$$

where:
  $t_1$ is the arrival time of the very first TW, and
  $t_F$ is the arrival time of the first return from the fault ($t_4$ in FIG. 1).

To emphasize reliance of the TW21 on the measurement of time, we rewrite the TW21 operating equation as follows:

$$(t_F - t_1) < 2 \cdot TW21M \cdot TWLPT \qquad \text{Eq. 5}$$

The left-hand side of Eq. 5 is the relay measurement. Responding only to TW arrival times, this measurement is not affected by CT and PT ratio errors, transients, and signal distortions in the lower (kHz) frequency band. The TW21 element does not use line impedance data when calculating the operating signal in Eq. 5, and therefore the operating signal is not affected by the finite accuracy of such line data.

The right-hand side of Eq. 5 is a threshold fixed for any given application—twice the product of the line length expressed in the TW line propagation time, TWLPT, and the user-preferred per-unit reach setting, TW21M. When used in the single-ended TW-based fault locator, a fault location may be determined with the accuracy of 1 or 2 tower spans. Because of this high accuracy, the TW21M reach may be set assertively, such as at 0.95 per unit, to cover 95 percent of the line length without a communication channel (compared with a typical reach setting of 80 percent for an impedance-based distance element).

Figure 2:
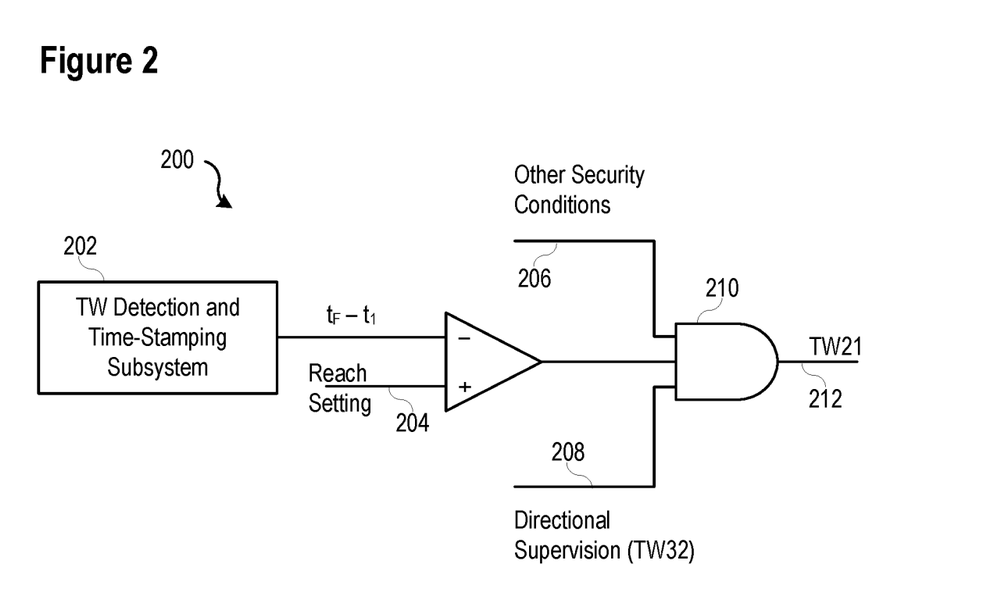
FIG. 2 illustrates a simplified logic diagram of a traveling wave distance element consistent with embodiments of the present disclosure.

FIG. 2 illustrates a simplified logic diagram of a traveling wave distance element 200 consistent with embodiments of the present disclosure. A difference between the arrival time of the first return from the fault ($t_F$) and the arrival time of the first TW associated with the fault ($t_1$) at the terminal ($t_F$-$t_1$) is determined by a TW detection and time-stamping subsystem 202. The difference is representative of a distance to the fault as per Eq. 3. The difference is compared against a reach setting 204. The reach setting 204 may be a setting related to the zone of protection of this particular protection element, such as given by the right-hand side of Eq. 5. If the difference is within the zone of protection (i.e., is less than the reach setting 204), then an output 212 of traveling wave distance element 200 may be asserted. The assertion of the output 212 may be used to apply a protective action such as, for example, tripping to open a line.

According to the illustrated embodiment, the traveling wave distance element 200 may be made more secure by requiring other conditions to exist or be determined before the output 212 is asserted. As illustrated, a directional supervision (TW32) input 208 input may indicate that the fault is in a direction of the TW21 element, typically forward. Furthermore, other security conditions 206 may be required in addition to the directional supervision 208 for the traveling wave distance element 200 to solve challenges related to protection security as described below.

Several challenges remain in a successful implementation of the TW21 element. For example, the distance-to-fault calculation shown in Eq. 3 works well if the element correctly identifies the first return from the fault; however, if another TW is mistaken for the first return from the fault, the calculation of the distance-to-fault calculation will be inaccurate. As illustrated in FIG. 1, the first TW that arrived at $t_1$ continued toward Terminal B, reflected from the terminal, and then returned to the local terminal (S) at time $t_2$. If a TW-based system mistook $t_2$ for the first return from the fault, the distance-to-fault calculation result would be incorrect. Similarly, the first TW that arrived at the remote terminal (R) reflects from Terminal R and returns to the local terminal (S), propagating through the fault point (F). This TW arrives at the local terminal at $t_3$. If the TW21 algorithm mistook $t_3$ for the first return from the fault, the distance-to-fault calculation result would also be incorrect.

Figure 3:
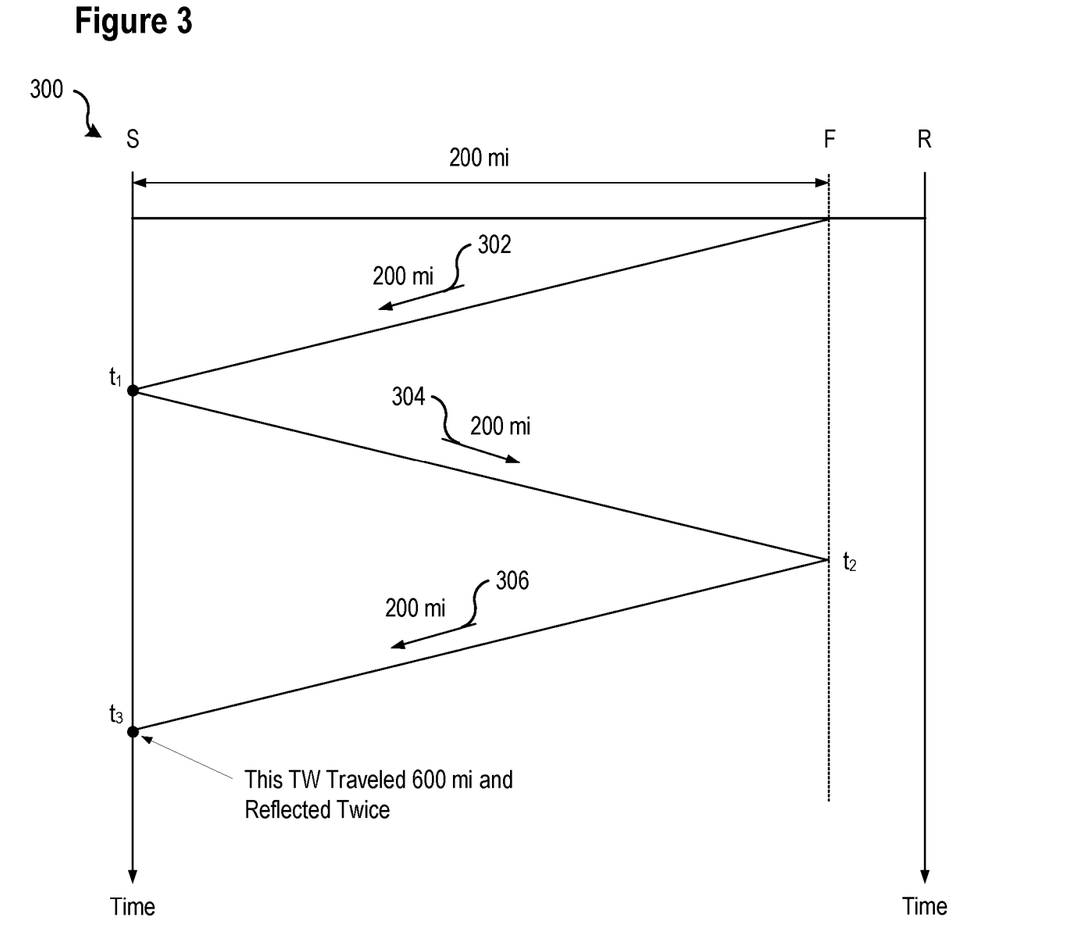
FIG. 3 illustrates a Bewley diagram illustrating a pattern of reflections of a traveling wave from a fault consistent with embodiments of the present disclosure.

FIG. 3 illustrates a Bewley diagram illustrating a pattern of reflections of a traveling wave from a fault consistent with embodiments of the present disclosure. As illustrated a fault occurs 200 miles from a bus S. As they travel, TWs attenuate and disperse. Attenuation refers to a phenomenon where the TW magnitude gradually reduces as the TW travels a long distance. Dispersion refers to a phenomenon where the initial sharp change in the current or voltage softens as the TW travels a long distance. The longer the distance a TW travels, the more profound the attenuation and dispersion. Profound attenuation and dispersion may make it more difficult to identify and time-stamp a TW.

A first traveling wave 302 is launched by the fault in the direction of bus S and arrives a time $t_1$. Traveling wave 302 reflects from bus S, resulting in reflected traveling wave 304, which propagates in the direction of the fault, and arrives at a time $t_2$. Reflected traveling wave 304 again reflects from the fault, resulting in a second reflected traveling wave 306, which propagates in the direction of bus S, and arrives at time $t_3$.

By the time traveling wave 306 arrives at bus S, it has traveled 600 mi and reflected twice. As a result, traveling wave 306 may have a low magnitude and may be considerably dispersed. The low magnitude and high dispersion may create sensitivity and accuracy challenges for a TW21 element; however, high-fidelity signals associated with traveling waves may be analyzed by various systems and methods disclosed herein to estimate a location of a fault based on different modes (i.e., an aerial mode and a ground mode) to provide an estimated location of a fault. The estimated location based on dispersion be used by a traveling wave system to increase the accuracy of the identification of reflections from a fault, and/or to confirm other methods used to measure a distance to a fault, and accordingly, may increase the security of such traveling wave protection system.

Traveling waves couple between the faulted and healthy phases as they travel along the line. In general, the three traveling waves in the phase conductors can be broken down into two sets of aerial modes (alpha and beta) and one ground mode.

The ground mode is typically very dispersed, and as such, is typically avoided in TW-based protection or fault locating. The ground mode is calculated using Eq. 6.

$$i_{TW\_GROUND} = \frac{i_{TWA} + i_{TWB} + i_{TWC}}{3} \qquad \text{Eq. 6}$$

The alpha mode typically provides a good representation of the three phase TWs for ground faults. It can be calculated with references to Phases A, B, and C, assuming that Phase A, B, or C is faulted. Therefore, there are three alpha modes using Eqs. 7-9.

$$i_{TW\_ALPHA\_A} = \frac{2i_{TWA} - i_{TWB} - i_{TWC}}{3} \qquad \text{Eq. 7}$$

$$i_{TW\_ALPHA\_B} = \frac{2i_{TWB} - i_{TWC} - i_{TWA}}{3} \qquad \text{Eq. 8}$$

$$i_{TW\_ALPHA\_C} = \frac{2i_{TWC} - i_{TWB} - i_{TWA}}{3} \qquad \text{Eq. 9}$$

Similarly, the beta mode is a good representation of the three phase TWs for phase-to-phase faults. It can be calculated assuming that Phases A and B, B and C, or C and A are faulted. There are three beta modes using Eqs. 10-12.

$$i_{TW\_BETA\_AB} = \frac{i_{TWA} - i_{TWB}}{\sqrt{3}} \qquad \text{Eq. 10}$$

$$i_{TW\_BETA\_BC} = \frac{i_{TWB} - i_{TWC}}{\sqrt{3}} \qquad \text{Eq. 11}$$

$$i_{TW\_BETA\_CA} = \frac{i_{TWC} - i_{TWA}}{\sqrt{3}} \quad \text{Eq. 12}$$

Typically, the mode with the highest magnitude among the six aerial modes is the correct representation of the fault type and the TW signal launched by that fault. In various embodiments, a system may identify and analyze the alpha mode that yields the highest initial TW magnitude.

Aerial and ground modes are different representations of TWs in a multiphase overhead power line. All modes are linear combinations of the phase signals. The ground mode in a three-phase line, as expressed in Eq. 6, is greatly affected by its separate return path (ground wires and earth), and therefore exhibits large dispersion. The aerial modes (such as the alpha mode expressed in Eq. 7, for example) travel on the power line, are little affected by the ground path, and therefore exhibit considerably smaller dispersion than the ground mode.

A ground mode may be more significantly disbursed in electric power systems than an aerial mode. The effect of such dispersion may be a delay in a time at which a ground mode signal corresponding to a traveling waves is detected by a detection system in comparison to the aerial mode. In various embodiments consistent with the present disclosure, the difference in the time between the detection of an aerial mode and a ground mode associated with a traveling wave may provide information about the location of a fault.

It is commonly stated that the ground and aerial modes have "different propagation velocities" or "different phase velocities." Such statements reflect the fact that in measurements systems, the arrival times of the traveling waves appear to be different because the arrival time is typically determined based on the midpoint of the step change in the TW signal. It is only the midpoint of a more or less dispersed TW that arrives later or earlier based on the degree of dispersion—as all the modes are linear combinations of the same three phase signals, all the modes start to change at the same time. The difference in dispersion rates between the aerial model and the ground is a function of the distance to the fault. Accordingly, the difference in dispersion rates may be used to estimate or calculate a distance to the fault from a single instance of a traveling wave. The estimated distance to the fault based on the difference in an arrival time between a ground mode and an aerial mode may be used to provide additional security in a TW21 system.

Figure 4A:
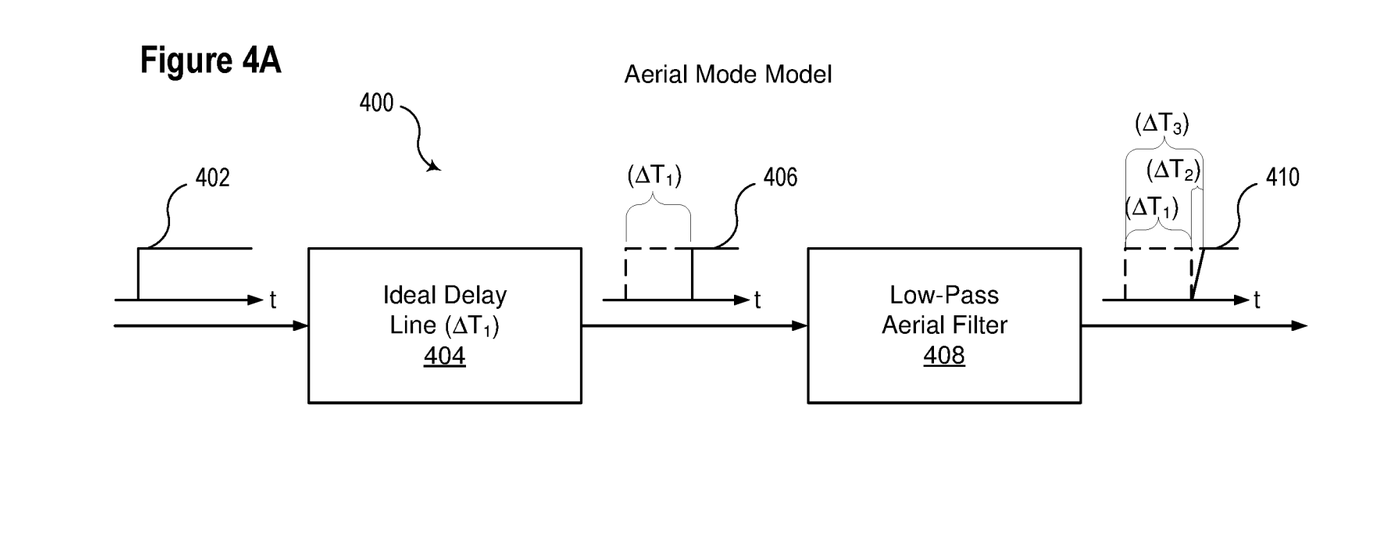
FIG. 4A illustrates a conceptual representation of an aerial mode model of a step function passing through an electric power transmission line comprising an ideal delay and a low-pass aerial filter consistent with embodiments of the present disclosure.

FIG. 4A illustrates a simplified model of an aerial mode 400 for a step function 402 passing through an electric power transmission line. The model comprises an ideal delay line 404 and a low-pass aerial filter 408 consistent with embodiments of the present disclosure. Step function 402 may represent a traveling wave for purposes of illustration in connection with FIG. 4A.

The ideal delay line 404 may represent a propagation delay ($\Delta T_1$) as the step function 402 traverses the electric power transmission line. The propagation delay ($\Delta T_1$) may be determined by dividing the length of the electric power transmission line by the propagation speed of the step function 402. The shape of step function 406 is not changed by the ideal delay line 404.

The low-pass aerial filter 408 may represent the attenuation of high-frequency signals in the step function 402. The attenuation of the step function 402 may be attributable to frequency-dependent components, such as inductance and capacitance, in the electric power transmission line. The attenuation of high-frequency components of step function 406 results in a signal 410 that ramps up over time, rather than a sharp edge. The aerial low pass-filter represents the attenuation and dispersion of the aerial models.

The slope introduced by the low-pass aerial filter 408 may add a time-delay ($\Delta T_2$) to the resulting signal. Various systems and methods consistent with the present disclosure may utilize techniques to estimate or calculate the arrival of a traveling wave under the presence of noise in the signal. Such techniques may include various thresholds, smoother circuits, differentiator smoother circuits, and the like. These techniques may reduce the impact of noise and increase the reliability of the accurate detection of traveling waves.

The total delay ($\Delta T_3$) from the generation of step function 402 to signal 410 reaching a maximum value is the sum of the propagation delay ($\Delta T_1$) and the delay introduced by the low-pass aerial filter 408 together ($\Delta T_2$). Another way to describe it is that the mid-point of the ramp 410 arrives $\Delta T_2/2 + \Delta T_1$ after the original wave 402.

Figure 4B:
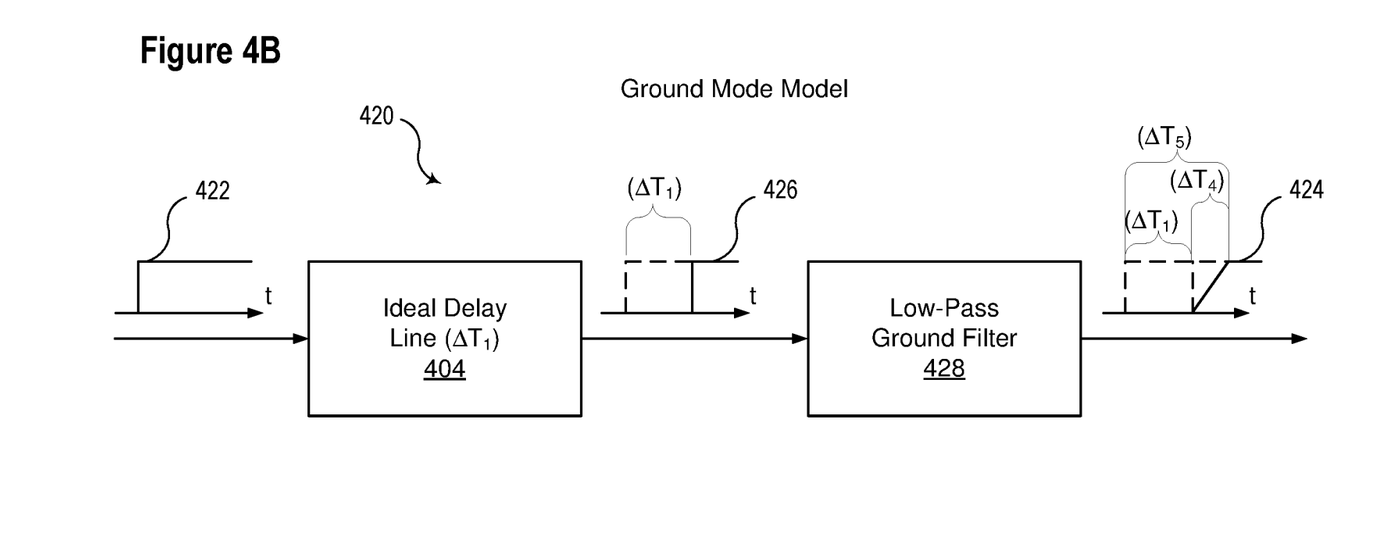
FIG. 4B illustrates a conceptual representation of a ground mode model of a step function passing through an electric power transmission line comprising an ideal delay and a low-pass ground filter consistent with embodiments of the present disclosure.

FIG. 4B illustrates a simplified model of a ground mode 420 of a step function 422 passing through an electric power transmission line comprising an ideal delay line 404 and a low-pass ground filter 428 consistent with embodiments of the present disclosure. Step function 422 and step function 402 may occur at the same time because they are created by the same event (e.g., a fault). The ground mode model 420 includes the same ideal delay line 404 because step function 422 and step function 402 traverse the same line and were generated at the same location (e.g., the location of the fault).

Low-pass ground filter 428 may more severely attenuate high-frequency signals than low-pass aerial filter 408. The greater attenuation of high-frequency signals may contribute to a more gradual slope than signal 410. Accordingly, the time required for signal 424 to ramp to a maximum value ($\Delta T_4$) exceeds the ramp time ($\Delta T_2$)) of signal 410. Another way to describe it is that the mid-point of the ramp 424 arrives $\Delta T_4/2 + \Delta T_1$ after the original wave 422 and therefore after the wave 402. In various embodiments, the difference between the arrival of the ground mode and the aerial mode ($\Delta T_4/2$ versus $\Delta T_2/2$) may be used to obtain information about the location of a fault.

Figure 5:
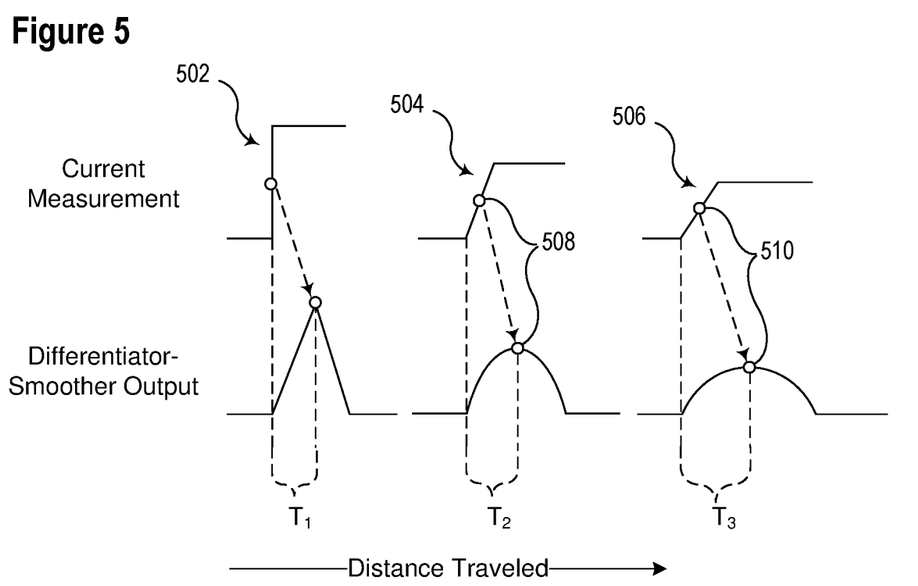
FIG. 5 illustrates examples of the effects of attenuation and dispersion on a step function traversing an electric power line and the corresponding outputs from a differentiator-smoother consistent with embodiments of the present disclosure.

FIG. 5 illustrates examples of the effects of attenuation and dispersion on a step function traversing an electric power line and the corresponding outputs from a differentiator-smoother consistent with embodiments of the present disclosure. Attenuation refers to a phenomenon where the magnitude of a traveling wave is reduced as it traverses along the line. In some embodiments, systems and methods consistent with the present disclosure may use a differentiator-smoother filter with an adequately long data window. A differentiator-smoother output spreads out a change in the current measurement into a pulse that lasts as long as the filter's data window. A differentiator-smoother filter may allow a system consistent with the present disclosure to accurately and consistently capture an arrival time of a traveling wave without regard to the magnitude of the traveling wave.

An ideal step function 502 may represent a traveling wave launched by a fault on an electric transmission line. The time of the peak of the differentiator-smoother output 502 corresponds to the time of the step in the current, with a time difference ($T_1$) equal to the fixed delay of the differentiator-smoother filter. Hence, the time of the peak of the differentiator-smoother output is not affected by the magnitude of the step in the current. Accordingly, a differentiator-smoother provides a simple and robust solution to attenuation, signal-loss due to transmission and reflection, and the natural variability of the TW current signal because of the voltage point-on-wave value at the fault location. Also, the smoothing part of the filter attenuates any high-frequency noise (ringing) in the TW signal, as well as the impact of analog-to-digital converter resolution for traveling waves of a small magnitude.

The effects of dispersion cause the current measurement to be a ramp rather than a step, as illustrated by signals 504 and 506. The greater the distance traveled, the greater the effect of dispersion on high-frequency components of the signal. Higher dispersion decreases the slope of the ramp, as illustrated by comparing signals 504 and 506.

The peak of the output from the differentiator-smoother consistently points to the midpoint 508, 510 of the traveling wave ramp. Systems and methods consistent with the present disclosure may use the peak of the differentiator-smoother output as part of a traveling wave detection algorithm. Accordingly, the time stamp of a traveling wave may be delayed by dispersion. The delay associated with the dispersion of signal 504 may be determined as the difference between $T_2$ and $T_1$. Similarly, the delay associated with the dispersion of signal 506 may be determined as the difference between $T_3$ and $T_1$. The difference between the arrival of the aerial mode and the ground mode may be on the order of a few microseconds in typical electric power system. For example, a transmission line of a few hundred miles may exhibit a difference of approximately 3-5 microseconds between the aerial mode and the ground mode based on the location of a fault.

Figure 6:
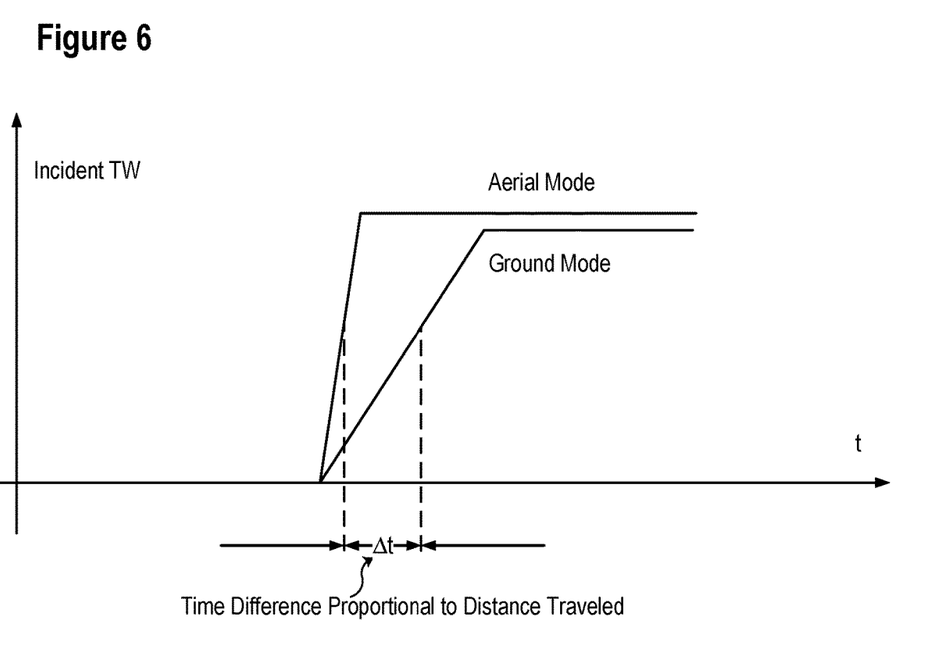
FIG. 6 illustrates a conceptual representation for using the aerial mode measurement and the ground mode measurement to determine a distance to a fault consistent with embodiments of the present disclosure.

FIG. 6 illustrates a conceptual representation for using the aerial mode model and the ground mode model to determine a distance to a fault consistent with embodiments of the present disclosure. Systems and methods consistent with the present disclosure may calculated arrival times of a traveling wave using different traveling wave mode signals, which can be used to determine whether the fault is within a zone of protection. Where other techniques are used to estimate a fault location, the location estimated based on dispersion may be used to verify the determined distance. For example, a TW21 system may determine a distance to a fault by identifying a first traveling wave and a reflection of the first traveling wave from a fault, as discussed in connection with FIG. 1. As noted, however, the determination of the distance to the fault may be incorrect if the reflection is incorrectly identified. Systems and methods disclosed herein may be used to verify that a distance determined based on an identified reflection is consistent with an estimated distance based on dispersion. Where the distances determined in these two ways are consistent, a TW21 system consistent with the present disclosure may be selectively enabled. Similarly, where the distances are inconsistent, a TW21 consistent with the present disclosure may be retrained. Moreover, the measurement based on the difference in dispersion can be performed more than once. In reference to FIG. 3, the first measurement may be performed on the wave 302 that arrived at t1. The difference in dispersion between the ground and aerial modes of wave 302 corresponds to the distance traveled of 200 mi. Also, the differences in dispersion can be checked for the wave 306 arriving at t3. The difference in dispersion between the ground and aerial modes for wave 306 corresponds to the distance traveled of 600 mi.

Figure 7:
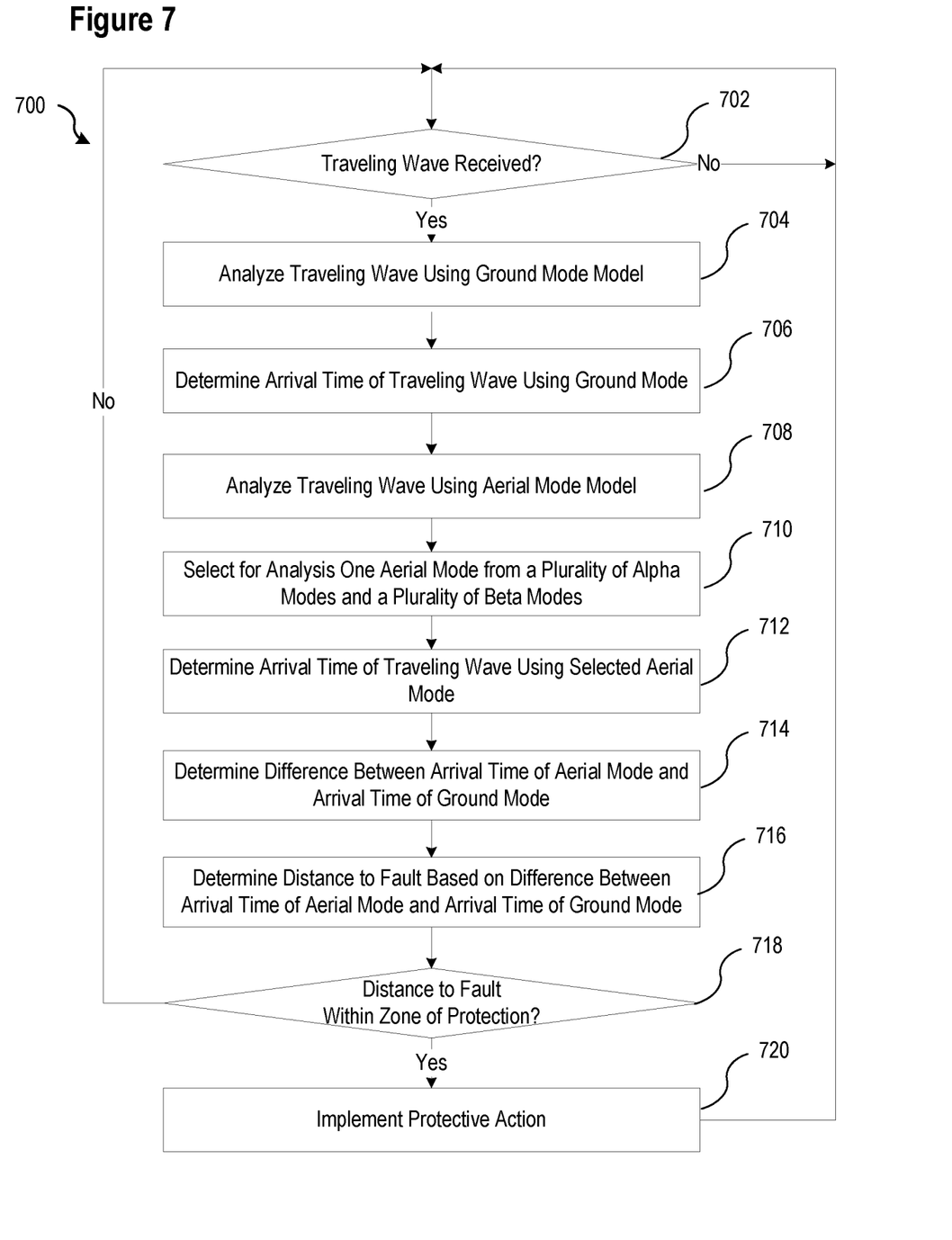
FIG. 7 illustrates a flow chart of a method for locating a fault using a dispersion-based system consistent with embodiments of the present disclosure.

FIG. 7 illustrates a flow chart of a method 700 for locating a fault using a dispersion-based system consistent with embodiments of the present disclosure. At 702 method 700 may determine whether a traveling wave has been received.

Figure 8:
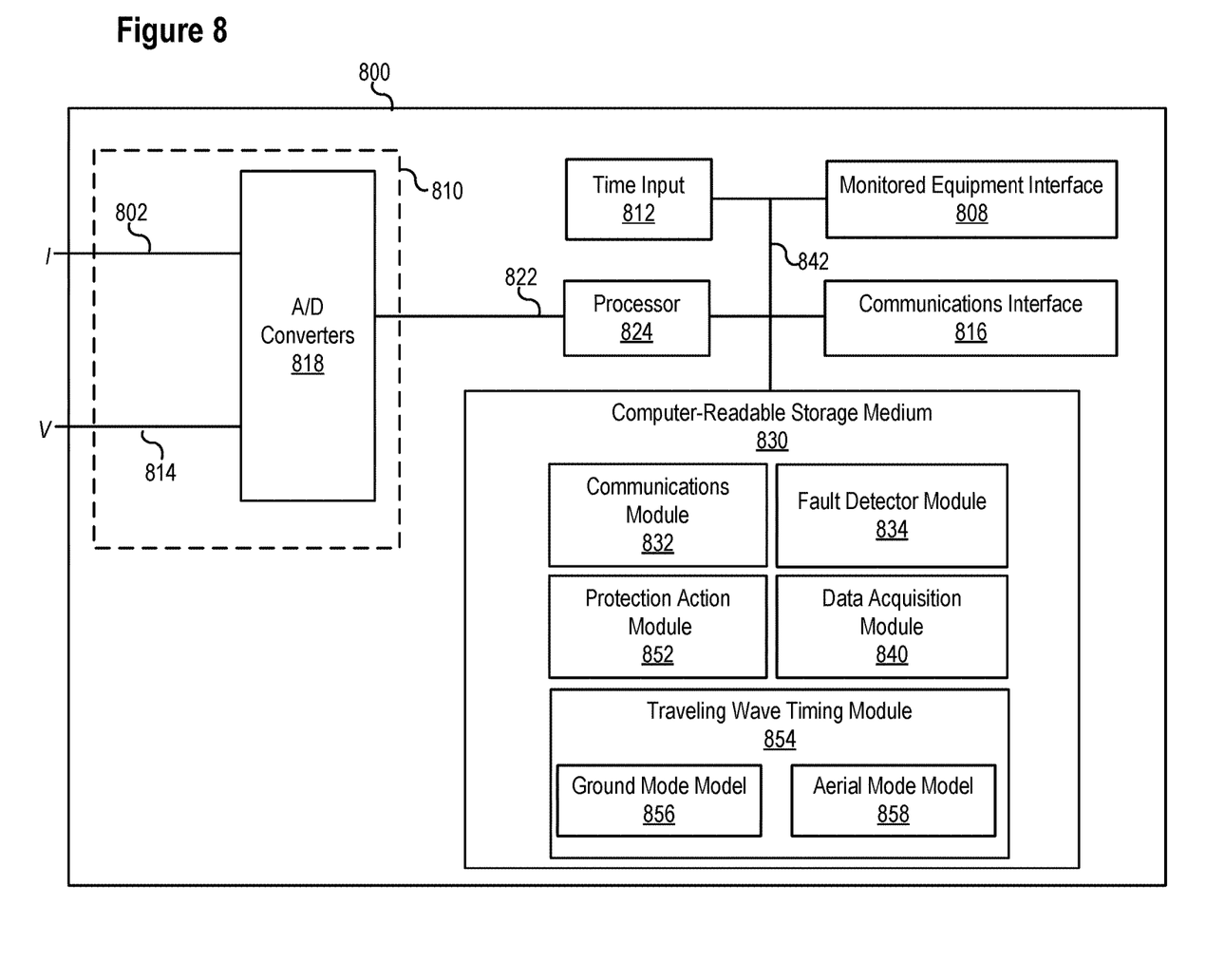
FIG. 8 illustrates a functional block diagram of a system for detecting faults and estimating a fault location using traveling waves consistent with certain embodiments of the present disclosure.

A variety of systems may be utilized to detect traveling waves, such as the system illustrated in FIG. 8.

At 704, the traveling wave may be analyzed using a ground mode model. The analysis using the ground mode model may be used at 706 to determine an arrival time of the traveling wave using the ground mode model. In certain embodiments, a differentiator-smoother filter may be used. In such embodiments, the peak of the output of the differentiator-smoother may be identified as the arrival time of the ground mode. The peak output of the differentiator-smoother may correspond to a midpoint of a ramp of a traveling wave.

At 708, the traveling wave may be analyzed using an aerial mode model. As described above, the aerial mode model may comprise a plurality of alpha modes and a plurality of beta modes. The alpha mode typically provides a good representation of the three-phase TWs for ground faults. Similarly, the beta mode is a good representation of the three-phase TWs for phase-to-phase faults. In various embodiments the mode with the highest magnitude among the various aerial modes may be selected at 710.

At 712, an arrival time of the traveling wave may be determined using the selected aerial mode. In some embodiments, the peak of an output of a differentiator-smoother may be identified as the arrival time of the aerial mode.

At 714, the difference between the arrival time of the traveling wave according to the selected aerial mode and the arrival time of the traveling wave according to the ground mode may be determined. As described herein, the difference between the arrival time of the traveling wave based on the aerial mode model and the arrival time of the traveling wave based on the ground mode model is related to the distance to the fault. A greater difference between arrival times corresponds to a greater distance to the fault due to increased dispersion as the traveling wave traverses an electric power transmission line.

At 716, a distance to the fault may be determined based on the difference between the arrival times of the traveling wave based on the aerial mode model and the ground mode model. The distance may be determined using a variety of techniques. For example, in some embodiments, a relationship may be determined by the difference between the arrival times and the parameters of electric power transmission lines. In other embodiments, information from known fault locations and measured differences between arrival times may be utilized to generate a model. The model may utilize known data points to develop and refine a function relating the difference between arrival times of an aerial mode and a ground mode with a location or a distance to a fault. The model may be updated and refined each time a fault occurs by adding data associated with the fault (e.g., a location and a difference between arrival times of the ground mode and the aerial mode). Also, a relative check can be utilized. For example, the difference in dispersion between the waves 302 and 306 in FIG. 3 shall be approximately 1:3 because the wave 306 traveled a distance 3 times longer than the wave 302.

In certain embodiments, a system implementing method 700 may be used to determine whether a fault is within a reach setting or a zone of protection of a protective device at 718. If the fault location is determined to be within the reach setting or the zone of protection, a signal may be asserted that enables various actions to be taken, such as tripping a breaker. At 720, a protective action may be implemented. If the location of the fault is not within a zone of protection, method 700 may restrain from implementing a protective action and proceed from 718 to 702. In other embodiments, the determination of method 700 may be used to verify other techniques for determining a fault location and/or determining whether a fault is in a zone of protection. In one specific embodiment, method 700 may provide an input to a system, such as system 200 in FIG. 2 that is used to selectively enable or disable a TW21 system by generating a signal associated with input 206.

FIG. 8 illustrates a functional block diagram of a system 800 for detecting and locating faults using traveling waves consistent with embodiments of the present disclosure. More particularly, system 800 may analyze traveling waves using a ground mode model and an aerial mode model and to determine a difference in the arrival times of traveling waves based on the ground mode model and the aerial mode model. Based on the difference in the arrival times, system 800 may determine whether to implement a protective action (e.g., tripping a breaker) or to take any other action (e.g., selectively enabling or disabling a TW21 system).

System 800 may be implemented using hardware, software, firmware, and/or any combination thereof. In some embodiments, system 800 may be embodied as an IED, while in other embodiments, certain components or functions described herein may be associated with other devices or performed by other devices. The specifically illustrated configuration is merely representative of one embodiment consistent with the present disclosure.

Traveling waves may be measured by current transformers, which may be installed at the ends of transmission lines in substations. Current transformers typically have enough fidelity to measure current traveling waves with adequate accuracy for practical protection and fault locating applications. However, a current transformer measures the current at the point of its installation at the line terminal which is always a discontinuity in the characteristic impedance, and therefore it measures the sum of the incident and reflected current traveling waves. It does not measure the incident wave separately and it does not allow separating of the waves into incident, reflected, and transmitted waves.

The voltage and current traveling waves are linked with the characteristic impedance of the line, and according, may be separated into the incident, reflected and transmitted components. The characteristic impedance can be different for the aerial modes and the ground mode. This separation may be performed using Eq. 13 for voltage traveling waves or Eq. 14 for current traveling waves.

$$v_{incident} = \frac{V_{TW} - i_{TW}Z_c}{2}$$ Eq. 13
$$v_{reflected} = \frac{V_{TW} + i_{TW}Z_c}{2}$$

$$i_{incident} = \frac{V_{TW}/Z_c - i_{TW}}{2}$$ Eq. 14
$$i_{reflected} = \frac{V_{TW}/Z_c + i_{TW}}{2}$$

Accurate measurements of both the total current traveling wave ($i_{TW}$) and the voltage traveling wave ($V_{TW}$) are needed to separate incident, reflected, and transmitted components. Current transformers may be used in some embodiments because they provide sufficiently accurate current traveling wave measurements. High-fidelity voltage measurements may be obtained in various embodiments using the systems and methods disclosed in U.S. patent application Ser. No. 16/137,186, titled HIGH-FIDELITY VOLTAGE MEASUREMENT USING A CAPACITANCE-COUPLED VOLTAGE TRANSFORMER, and filed on Sep. 20, 2018, which is incorporated herein by reference.

Wave separation into the incident, reflected, and transmitted traveling waves may allow better utilization of the traveling wave information as compared with using just traveling wave measurements from current transformers, which are the sums of the incident and reflected waves.

System 800 may be implemented using hardware, software, firmware, and/or any combination thereof. In some embodiments, system 800 may be embodied as an IED, while in other embodiments, certain components or functions described herein may be associated with other devices or performed by other devices. The specifically illustrated configuration is merely representative of one embodiment consistent with the present disclosure.

System 800 includes a communications interface 816 to communicate with devices and/or IEDs. In certain embodiments, the communications interface 816 may facilitate direct communication with other IEDs or communicate with systems over a communications network. System 800 may further include a time input 812, which may be used to receive a time signal (e.g., a common time reference) allowing system 800 to apply a time-stamp to the acquired samples. In certain embodiments, a common time reference may be received via communications interface 816, and accordingly, a separate time input may not be required for time-stamping and/or synchronization operations. One such embodiment may employ the IEEE 1588 protocol. A monitored equipment interface 808 may receive status information from, and issue control instructions to, a piece of monitored equipment (such as a circuit breaker, conductor, transformer, or the like).

Processor 824 processes communications received via communications interface 816, time input 812, and/or monitored equipment interface 808. Processor 824 may operate using any number of processing rates and architectures. Processor 824 may perform various algorithms and calculations described herein. Processor 824 may be embodied as a general-purpose integrated circuit, an application-specific integrated circuit, a field-programmable gate array, and/or any other suitable programmable logic device.

In certain embodiments, system 800 may include a sensor component 810. In the illustrated embodiment, sensor component 810 may receive high-fidelity current measurements 802 and/or high-fidelity voltage measurements 814. The sensor component 810 may use comprise A/D converters 818 that sample and/or digitize filtered waveforms to form corresponding digitized current and voltage signals provided to data bus 822. High-fidelity current measurements 802 and/or high-fidelity voltage measurements 814 may include separate signals from each phase of a three-phase electric power system. A/D converters 818 may be connected to processor 824 by way of data bus 822, through which digitized representations of current and voltage signals may be transmitted to processor 824.

A non-transitory computer-readable storage medium 830 may be the repository of various software modules that perform the methods, calculations, and determinations described herein. A data bus 842 may link monitored equipment interface 808, time input 812, communications interface 816, and computer-readable storage medium 830 to processor 824.

Communications module 832 may allow system 800 to communicate with any of a variety of external devices via communications interface 816. Communications module 832 may communicate using a variety of data communication protocols.

Data acquisition module 840 may collect data samples, such as current and voltage measurements associated with traveling waves. The data samples may be associated with a timestamp and made available for retrieval and/or transmission to a remote IED via communications interface 816. Traveling waves may be measured and recorded in realtime, since they are transient signals that dissipate rapidly in an electric power delivery system. Data acquisition module 840 may operate in conjunction with fault detector module 834. Data acquisition module 840 may control recording of data used by the fault detector module 834. According to one embodiment, data acquisition module 840 may selectively store and retrieve data and may make the data available for further processing. Such processing may include processing by fault detector module 834, which may identify distortions in traveling waves.

Traveling wave identification module 844 may compare distortions of traveling waves. As described and illustrated herein, traveling wave distortions may be used to determine the origin or reflection of traveling waves. Traveling waves with similar distortions may be determined to have similar origins or reflections. Traveling wave identification module 844 may identify traveling waves based on detected distortions. The fault detector module 834 may determine a fault according to several traveling wave protection algorithms using the identifications of the traveling waves according to several embodiments herein.

Traveling wave timing module 854 may be configured to calculate arrival times of an instance of a traveling wave using different models, such as a ground mode model 856 and an aerial mode model 858. The aerial mode model 858 may further analyze a plurality of alpha and beta modes and select one of the modes as representing the type of fault (i.e., a phase-to-phase fault, a phase-to-ground fault, etc.). In some embodiments, the mode that results in the greatest traveling wave magnitude may be selected.

The traveling wave timing module 854 may be configured to calculate a difference in arrival times of an instance of a traveling wave between the ground mode model and the selected aerial mode model. The traveling wave timing module 854 may calculate the arrival times as midpoints in the traveling wave according to the different models. The time difference may be used by the fault detector module 834 to determine whether the fault that launched the traveling wave is within the predetermined zone of protection. The fault detector module 834 may be in communication with the protection action module 852 to transmit a detection of a fault within the zone of protection.

A protective action module 852 may be configured to implement a protective action based on the declaration of a fault by the fault detector module 834. In various embodiments, a protective action may include tripping a breaker, selectively isolating a portion of the electric power system, etc. Still further, the protective action may comprise selectively enabling or disabling a TW21 system. In various embodiments, the protective action module 852 may coordinate protective actions with other devices in communication with system 800. In various embodiments, system 800 may be configured to provide protection based on instantaneous voltages and currents. Such signal components require shorter data windows but facilitate faster protection. Various embodiments of system 800 may be configured to achieve an operating time of approximately 1 millisecond.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system to detect a fault in an electric power delivery system, comprising:
   a data acquisition system to acquire a plurality of electric power delivery system signals from a first location of an electric power transmission line;
   a traveling wave system in communication with the data acquisition system to:
   detect a single instance of a traveling wave based on the plurality of electric power delivery system signals from the data acquisition system;
   analyze the traveling wave using a first mode to determine a first mode arrival time of the traveling wave;
   analyze the traveling wave using a second mode to determine a second mode arrival time of the traveling wave;
   calculate a time difference between the first mode arrival time and the second mode arrival time;
   a fault location system in communication with the traveling wave system to:
   receive the time difference from the traveling wave system; calculate a location of the fault based on the time difference; and
   a protection action module to implement a protective action based on the location of the fault.

2. The system of claim 1, wherein the first mode arrival time comprises a midpoint in the first mode, and the second mode arrival time comprises a midpoint in the second mode.

3. The system of claim 1, wherein the location of the fault is compared to a reach setting.

4. The system of claim 3, wherein the protective action is implemented when the distance to the fault is within the reach setting and the protective action is restrained when the fault is outside the reach setting.

5. The system of claim 4, wherein the protective action comprises one of actuating a circuit breaker to interrupt a flow of current flowing to the fault and enabling a fault distance determination system.

6. The system of claim 1, wherein the first mode comprises an aerial mode and the second mode comprises a ground mode.

7. The system of claim 6, wherein the aerial mode comprises a plurality of alpha modes and a plurality of beta modes, and the traveling wave system identifies one of the plurality alpha modes and the plurality of beta modes to analyze.

8. The system of claim 7, wherein the aerial mode identifies one of the plurality of alpha modes and one of the plurality of beta modes with the greatest magnitude, and the traveling wave system determines the first mode arrival time based on the selected mode.

9. The system of claim 1, wherein the fault location system further identifies a first maximum value of a first differentiator-smoother filter associated with the first mode, identifies second maximum value of a second differentiator-smoother filter associated with the second mode, the first mode arrival time corresponds to the first maximum value and the second mode arrival time corresponds to the second maximum value.

10. The system of claim 1, wherein the time difference is proportional to a distance of the electric power transmission line traversed by the traveling wave.

11. A method for detecting a fault in an electric power delivery system, comprising:
- acquiring a plurality of electric power delivery system signals from a first location of an electric power transmission line;
- detecting a single instance of a traveling wave based on the plurality of electric power delivery system signals;
- analyzing the traveling wave using a first mode to determine a first mode arrival time of the traveling wave;
- analyzing the traveling wave using a second mode to determine a second mode arrival time of the traveling wave;
- calculating a time difference between the first mode arrival time and the second mode arrival time;
- calculating a location of the fault based on the time difference; and
- implementing a protective action based on the location of the fault.

12. The method of claim 11, further comprising:
- determining the first mode arrival time based on a first midpoint in the first mode, and
- determining the second mode arrival time based on a second midpoint in the second mode.

13. The method of claim 11, further comprising comparing the location of the fault to a reach setting.

14. The method of claim 13, further comprising:
- implementing the protective action when the location of the fault is within the reach setting; and
- restraining the protective action when the location of the fault is outside the reach setting.

15. The method of claim 14, wherein the protective action comprises one of actuating a circuit breaker to interrupt a flow of current flowing to the fault and enabling a fault distance determination system.

16. The method of claim 11, wherein the first mode comprises an aerial mode and the second mode comprises a ground mode.

17. The method of claim 16, wherein the aerial mode comprises a plurality of alpha modes and a plurality of beta modes, and further comprising identifying one of the plurality of alpha modes and the plurality of beta modes to analyze.

18. The method of claim 17, wherein identifying one of the plurality of alpha modes comprises selecting one of the plurality of alpha modes and one of the plurality of beta modes with the greatest magnitude, and determining the first mode arrival time based on the selected mode.

19. The method of claim 11, further comprising:
- identifying a first maximum value of a first differentiator-smoother filter associated with the first mode;
- identifying a second maximum value of a second differentiator-smoother filter associated with the second mode; and
- wherein the first mode arrival time corresponds to the first maximum value and the second mode arrival time corresponds to the second maximum value.

20. The method of claim 11, wherein the time difference is proportional to a distance of the electric power transmission line traversed by the traveling wave.

21. The method of claim 11, wherein analyzing the plurality of electric power delivery system signals using the first mode and the second mode comprises using a differentiator-smoother filter.

* * * * *